(12) United States Patent
Harms et al.

(10) Patent No.: US 10,411,713 B2
(45) Date of Patent: Sep. 10, 2019

(54) SUPERCONDUCTING CIRCUITS BASED DEVICES AND METHODS

(71) Applicant: Microsoft Technology Licensing, LLC, Redmond, WA (US)

(72) Inventors: David C. Harms, Linthicum, MD (US); Quentin P. Herr, Ellicott City, MD (US); Anna Y. Herr, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 167 days.

(21) Appl. No.: 15/424,832

(22) Filed: Feb. 4, 2017

(65) Prior Publication Data

US 2018/0226974 A1 Aug. 9, 2018

(51) Int. Cl.
*H03K 19/195* (2006.01)
*H03K 19/21* (2006.01)
(Continued)

(52) U.S. Cl.
CPC ........... *H03K 19/195* (2013.01); *G06N 10/00* (2019.01); *H03K 19/21* (2013.01); *H03K 3/38* (2013.01); *H03K 17/92* (2013.01)

(58) Field of Classification Search
None
See application file for complete search history.

(56) References Cited

U.S. PATENT DOCUMENTS

| 4,275,314 A | 6/1981 | Fulton |
| 4,482,821 A | 11/1984 | Houkawa et al. |

(Continued)

FOREIGN PATENT DOCUMENTS

| JP | S58209228 A | 12/1983 |
| JP | S59167124 A | 9/1984 |

(Continued)

OTHER PUBLICATIONS

Bakolo, et al., "New Implementation of RSFQ Superconductive Digital Gates", In Journal of South African Institute of Electrical Engineers, vol. 104, Issue 3, Sep. 2013, pp. 90-96.

(Continued)

*Primary Examiner* — Minh D A
*Assistant Examiner* — James H Cho
(74) *Attorney, Agent, or Firm* — Ranjeev Singh; Singh Law, PLLC

(57) ABSTRACT

Superconducting circuits based devices and methods, including reciprocal quantum logic (RQL) based devices and methods are provided. In one example, a device comprising an output terminal, a first input terminal for receiving a first set of pulses, and a second input terminal for receiving a second set of pulses is provided. The first section may be configured to pass a single pulse received during a single clock cycle at any of the first input terminal or the second input terminal, but to not pass two or more positive pulses received during a single clock cycle at the first input terminal and the second input terminal. The second section, coupled to the first section, may be configured to, in response to the single pulse, generate a negative pulse after a predetermined fraction of a single clock cycle after providing a positive pulse at the output terminal.

18 Claims, 8 Drawing Sheets

(51) Int. Cl.
*H03K 17/92* (2006.01)
*G06N 10/00* (2019.01)
*H03K 3/38* (2006.01)

(56) References Cited

U.S. PATENT DOCUMENTS

| | | | |
|---|---|---|---|
| 5,124,583 A | 6/1992 | Hatano et al. | |
| 6,486,694 B1* | 11/2002 | Kirichenko | H03K 19/1954 326/3 |
| 6,734,699 B1* | 5/2004 | Herr | H03K 19/1952 326/1 |
| 7,129,869 B2* | 10/2006 | Furuta | G11C 7/06 341/133 |
| 7,724,020 B2 | 5/2010 | Herr | |
| 7,786,748 B1 | 8/2010 | Herr | |
| 7,977,964 B2* | 7/2011 | Herr | B82Y 10/00 326/4 |
| 9,543,959 B1 | 1/2017 | Carmean et al. | |
| 2003/0011398 A1* | 1/2003 | Herr | H03K 19/1954 326/3 |
| 2004/0022332 A1 | 2/2004 | Gupta et al. | |
| 2005/0035368 A1 | 2/2005 | Bunyk | |
| 2007/0077906 A1 | 4/2007 | Kirichenko et al. | |
| 2012/0184445 A1 | 7/2012 | Mukhanov et al. | |
| 2013/0040818 A1 | 2/2013 | Herr et al. | |
| 2017/0359072 A1* | 12/2017 | Hamilton | H03K 19/21 |

FOREIGN PATENT DOCUMENTS

| | | |
|---|---|---|
| JP | 2000068818 A | 3/2000 |
| WO | 02069498 A2 | 9/2002 |
| WO | 2008089067 A1 | 7/2008 |

OTHER PUBLICATIONS

Hosoki, et al, "Design and experimentation of BSFQ logic devices", In Journal of Superconductor Science and Technology, vol. 12, Issue 11, Nov. 1999, 773-775 pages.

Abirami, et al., "Design and Implementation of ERSFQ Based Gdi Technique Using Tanner", In International Journal of Research on Science Engineering and Technology, vol. 3, Issue 3, Mar. 2016, pp. 57-62.

"International Search Report & Written Opinion Issued in PCT Patent Application No. PCT/US2018/015815", dated Feb. 21, 2019, 23 Pages.

* cited by examiner

SUPERCONDUCTING CIRCUITS BASED DEVICES AND METHODS

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power they still consume power because of the need to maintain the state of CMOS transistors. In addition, because CMOS circuits are powered using DC voltage there is a certain amount of current leakage even when the CMOS circuits are inactive. Thus, even when such circuits are not processing information certain amount of power is wasted not only as a result of the requirement to maintain the state of the CMOS transistors, but also as a result of the current leakage.

An alternative approach to the use of processors and related components based on CMOS technology is the use of superconducting circuits based devices.

SUMMARY

In one example, the present disclosure relates to a device comprising an output terminal, a first input terminal for receiving a first set of pulses, and a second input terminal for receiving a second set of pulses. The first section may be configured to pass a single pulse received during a single clock cycle at any of the first input terminal or the second input terminal, but to not pass two or more positive pulses received during a single clock cycle at the first input terminal and the second input terminal. The second section, coupled to the first section, may be configured to, in response to the single pulse, generate a negative pulse after a predetermined fraction of a single clock cycle after providing a positive pulse at the output terminal.

In another aspect, the present disclosure is related to a method of operating a device comprising a first input terminal for receiving a first set of pulses, a second input terminal for receiving a second set of pulses, and an output terminal. The method may include passing a single pulse received during a single clock cycle at any of the first input terminal or the second input terminal, but not passing two or more positive pulses received during a single clock cycle at the first input terminal and the second input terminal. The method may further include in response to the single pulse, generating a negative pulse after a predetermined fraction of a single clock cycle after providing a positive pulse at the output terminal.

In another aspect, the present disclosure relates to an exclusive OR (XOR) logic gate comprising an output terminal, a first input terminal for receiving a first set of pulses, and a second input terminal for receiving a second set of pulses. The XOR logic gate may further include an unpowered stage comprising: (1) a first unpowered Josephson junction coupled between the first input terminal and a second terminal, and (2) a second unpowered Josephson junction coupled between the first input terminal and the second terminal, where the unpowered stage may be configured to pass pulses traveling in a first direction, where the first direction comprises a direction of travel of any pulses from any of the first input terminal or the second input terminal toward the output terminal and block pulses traveling in a second direction, opposite to the first direction. The XOR logic gate may further include a central junction coupled between the second terminal and a third terminal, where the central junction may be configured to pass a single pulse, received during a single clock cycle, but block two or more pulses, received during a single clock cycle. The XOR logic gate may further include a Josephson transmission line (JTL) network coupled between the third terminal and the output terminal, wherein the JTL network may be configured to generate the negative pulse after the predetermined fraction of the single clock cycle after providing the positive pulse at the output terminal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
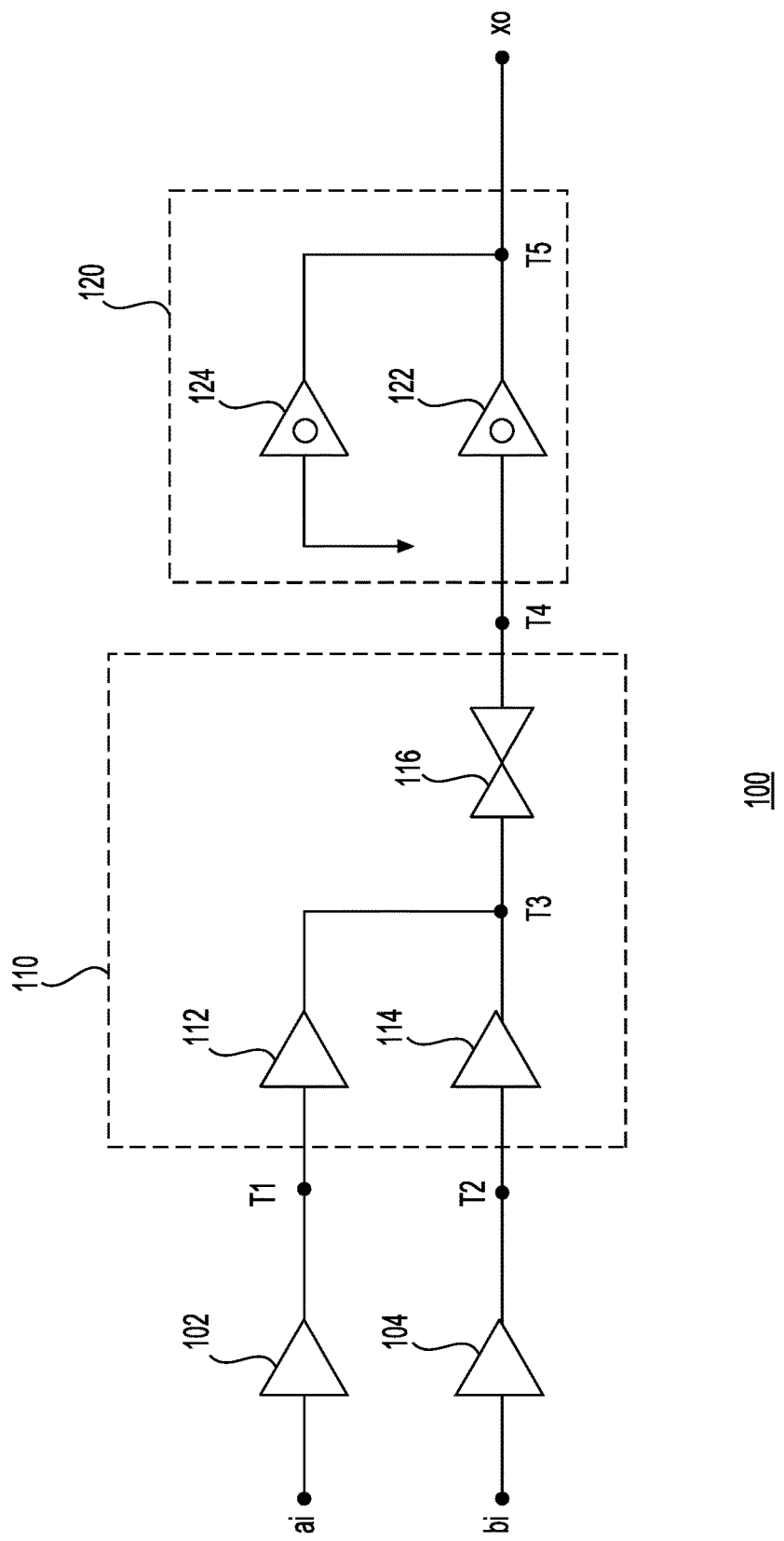
FIG. 1 shows a diagram of a superconducting device in accordance with one example.

Examples described in this disclosure relate to superconducting circuits based devices. Certain examples described in this disclosure relate to reciprocal quantum logic (RQL) based devices. Such RQL based devices may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance. An example of a superconductor is Niobium, which has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of a positive/negative pulse pairs during a clock cycle. The positive SFQ pulse may arrive during the positive part of the clock, whereas the negative pulse may arrive during the negative part of the clock. The building blocks of exemplary RQL circuits may include various types of logic gates. Exemplary logic gates described in this disclosure include exclusive-OR (XOR) logic gates and inverters.

In one example, a logic gate may include: (1) two input Josephson transmission lines (JTLs) and an unpowered stage (two unpowered JJs) that passes pulses from input to output, but that blocks back-travelling pulses; (2) a central junction that passes a single input pulse to the output but rejects input pulses on both inputs; and (3) an auxiliary Josephson transmission line (JTL) on the output that is terminated to ground, which generates the negative pulse on the output one-half clock cycle after the positive pulse. The auxiliary JTL may reset the logic gate every clock cycle. The output JTL clock phase may be delayed relative to the input JTL clock phase to create an allowed time window for the input pulses to arrive. This arrangement of components for an exclusive OR (XOR) logic gate may not require high-efficiency gate transformers that are physically large. In addition, the logic gate requires fewer Josephson junctions than conventional XOR logic gates. This may advantageously allow for higher density fabrication of superconducting circuits based devices. In addition, because the XOR operation may be completed using a single stage as opposed to two stages (an AND/OR gate followed by an AanB gate), the XOR operation may advantageously be completed in a shorter amount of time than such prior solutions.

In each of the examples described below, an alternating current (AC) clock may provide power to the Josephson junctions that require power, including Josephson transmission lines (JTLs), as needed. Two AC clock signals may be used to provide a two-phase clock or a four-phase clock. In one example, cross-wired transformers (not shown) may be used to produce a four-phase clock from two AC Clocks. For example, by coupling the clock lines to the Josephson junctions in the gates of a respective superconducting circuit in a wound or counter-wound fashion, four phases of clock may be derived. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation. As an example, as described below with respect to some of the examples of superconducting devices or circuits, one section of the device may receive an AC clock that lags the AC clock received by the other section in terms of phase. Example phase difference may be 90 degrees. The range of phase difference between two AC clocks may be 0 degrees to 135 degrees.

FIG. 1 shows a diagram of a superconducting device 100 in accordance with one example. Superconducting device 100 may provide the functionality associated with an exclusive OR (XOR) logic gate in accordance with one example. Superconducting device 100 may also provide the functionality associated with an inverter in accordance with another example. In one example, superconducting device 100 may process two inputs to generate an output. As part of this example, superconducting device 100 may implement the exclusive-OR gate functionality. In one example, the exclusive-OR functionality may relate to producing a logic 0 output if both inputs have the same value and producing a logic 1 output when one input has a different value from the other input. In this example, input ai may be received via a Josephson transmission line (JTL) 102 and another input bi may be received via Josephson line (JTL) 104. Superconducting device 100 may include a first section 110 and a second section 120 as shown in FIG. 1. First section 110 may include an unpowered Josephson junction (JJ) 112 coupled between terminals T1 and T3. First section 110 may further include an unpowered JJ 114 coupled between terminal T2 and terminal T3. First section 110 may further include a central junction 116 coupled between terminal T3 and terminal T4. Central junction 116 may include Josephson junctions powered by a first AC clock signal. Second section 120 may comprise a JTL network, including as an example JTL 122 coupled between terminal T4 and terminal T5, where terminal T5 may provide an output value xo. In this example, as part of the JTL network, another JTL (JTL 124) may be coupled between terminal T5 and ground. The Josephson junctions in the various components of second section 120 may be powered using a second AC clock signal, where the second AC clock signal may be delayed in phase by 90 degrees in relation to the phase of the first AC clock signal (used to power components in first section 110). The phase difference between two clocks may be in range of 0 degrees to 135 degrees. In terms of the operation, input signals comprising quantum pulses, such as single flux quantum (SFQ) pulses, may be received as inputs (e.g., ai and/or bi). In one example, first section 110 may be configured to pass a single positive pulse originating at the input but to reject two positive pulses originating in the same clock cycle. In addition, first section 112 may provide isolation between the two inputs ai and bi. Second section 120 may be configured to generate a negative output pulse half a clock cycle after a positive output pulse. Second section 120 may further be configured to reset superconducting device 100. In addition, second section 120 may provide isolation and gain. Although FIG. 1 shows a certain number of components of superconducting device 100 arranged in a certain manner, there could be more or fewer number of components arranged differently.

Figure 2:
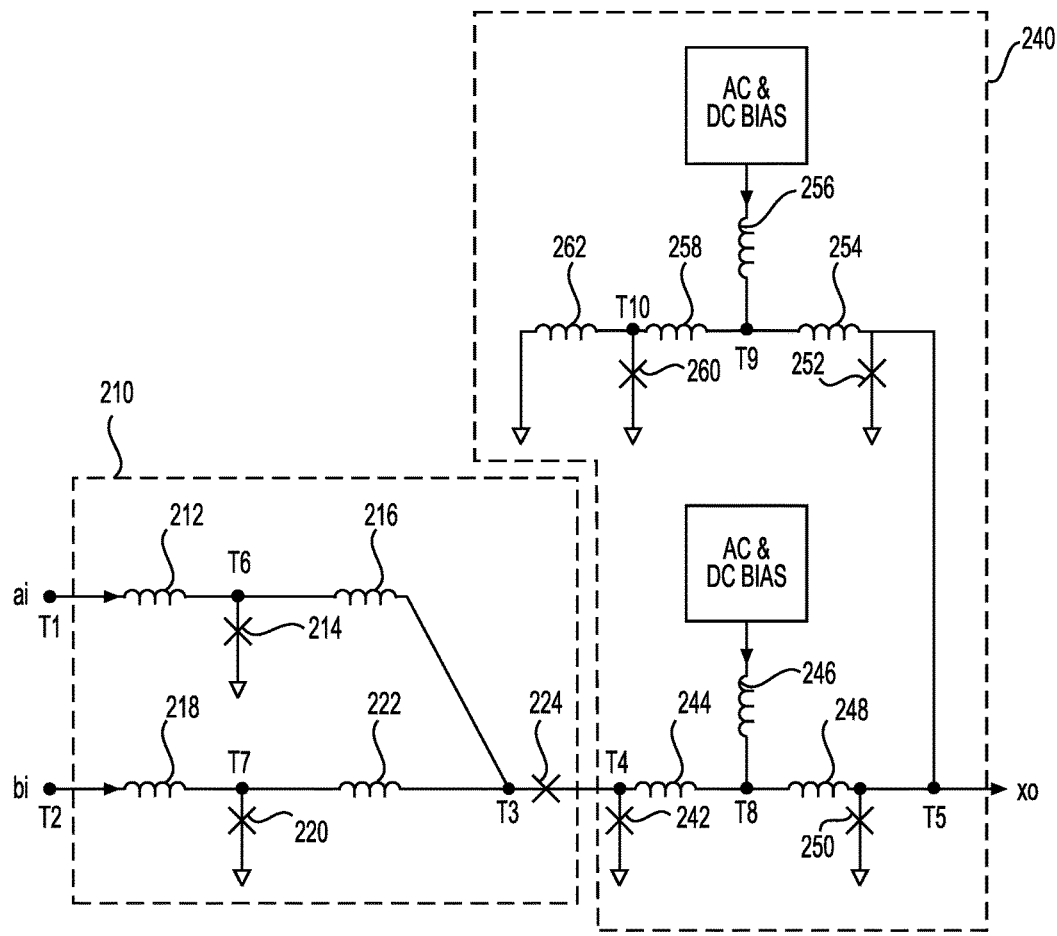
FIG. 2 shows an example superconducting circuit corresponding to superconducting device of FIG. 1.

FIG. 2 shows an example superconducting circuit 200 corresponding to superconducting device 100 of FIG. 1. Superconducting circuit 200 may provide the functionality associated with an exclusive OR (XOR) logic gate in accordance with one example. Superconducting circuit 200 may also provide the functionality associated with an inverter in accordance with another example. The example shown in FIG. 2 does not include the two JTLs at the input of the front section. Superconducting circuit 200 may include a first section 210 that may correspond to first section 110 of FIG. 1 and a second section 240 that may correspond to second section 120 of FIG. 1. First section 210 may include an inductor 212 coupled between terminal T1 and T6. A first input (ai) may be received via terminal T1. Superconducting circuit 200 may further include another inductor 218 coupled between terminal T2 and terminal T7. A second input (bi) may also be received via terminal T2. Superconducting circuit 200 may further include a Josephson junction (JJ) 214 coupled between terminal T6 and ground. Superconducting circuit 200 may further include a JJ 220 coupled between terminal T7 and ground. First section 210 may further include an inductor 216 coupled between terminal T6 and terminal T3. First section 210 may further include inductor 222 coupled between terminal T7 and terminal T3. First section 210 may further include a central junction 224. Central junction 224 may include Josephson junctions powered by a first AC clock signal. Second section 240 may include an inductor coupled between terminal T4 and terminal T8. Second section 240 may further include a JJ 242 coupled between terminal T4 and ground. Second section 240 may include an inductor coupled to receive AC/DC bias and terminal T8 as shown in FIG. 2. Second section 240 may further include inductor 248 coupled between terminal T8 and terminal T5. Terminal T5 may provide the output (xo) of superconducting circuit 200. Second section 240 may further include JJ 250 coupled between terminal T5 and ground. Second section 240 may further include JJ 252 coupled between terminal T5 and ground. Second section 240 may further include inductor 254 coupled with terminal T5 and terminal T9. Second section 240 may further include inductor 256 coupled to receive AC/DC bias and terminal T9. Second section 240 may further include inductor 258 coupled between terminals T9 and T10 as shown in FIG. 2. Second section 240 may further include JJ 260 coupled between terminal T10 and ground. Second section 240 may further include inductor 262 coupled between terminal T10 and ground. The Josephson junctions in the various components of second section 240 may be powered using a second AC clock signal, where the second AC clock signal may be delayed in phase by 90 degrees in relation to the phase of the first AC clock signal (used to power central junction 224 in first section 210). The phase difference between two clocks may be in range of 0 degrees to 135 degrees. Although FIG. 2 shows a certain number of components of superconducting circuit 200 arranged in a certain manner, there could be more or fewer number of components arranged differently.

Figure 3:
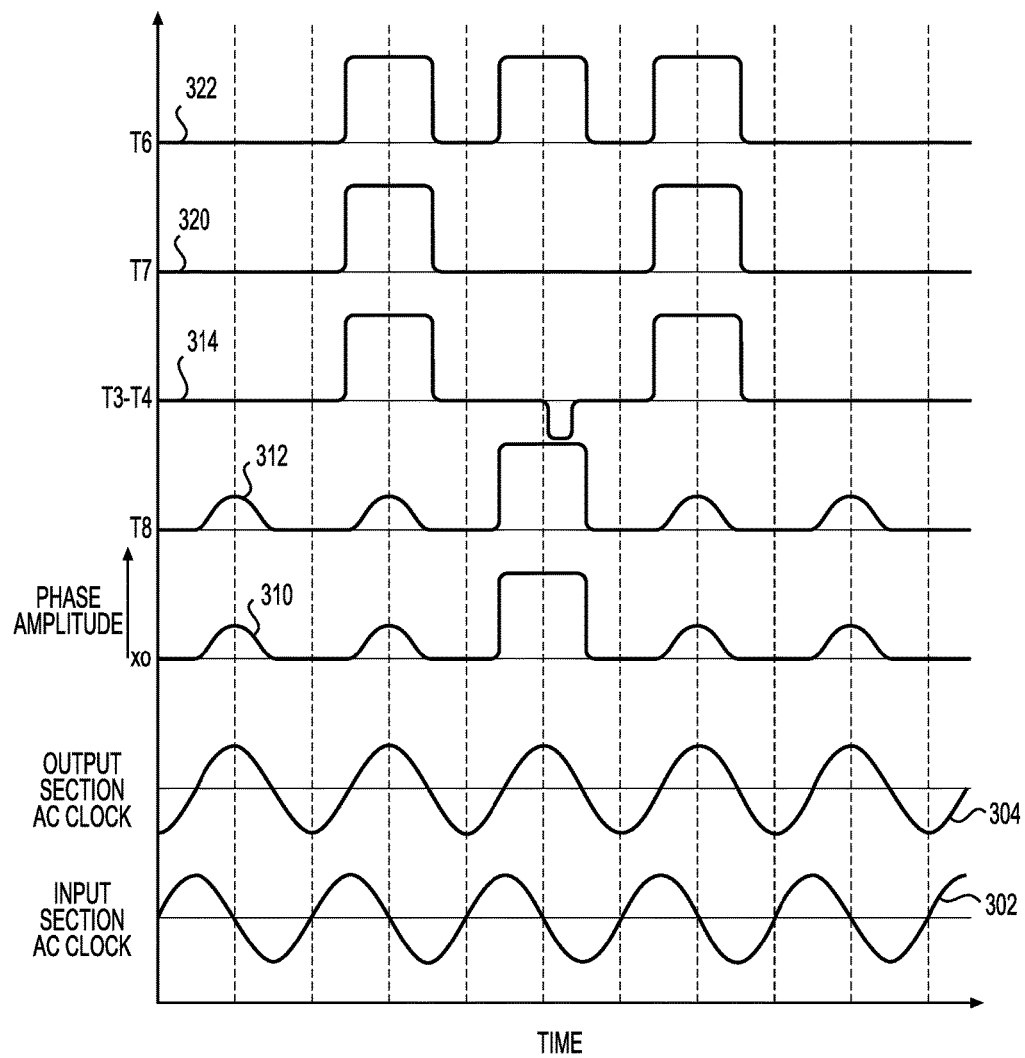
FIG. 3 shows waveforms associated with a superconducting circuit in accordance with one example.

FIG. 3 shows waveforms 300 associated with superconducting circuit 200 in accordance with one example. These waveforms represent a change in the superconductor phase amplitude in relation to time based on the inputs and the clock signals received by superconducting circuit 200, where the superconductor phase amplitude is the time-integral of the attendant voltage waveform. As discussed earlier, a first AC clock signal (labeled as INPUT SECTION AC CLOCK in FIG. 3) may be used to power components in the first section of superconducting circuit 200 and a second AC clock signal (labeled as OUTPUT SECTION AC CLOCK in FIG. 3) may be used to power components in the second section of superconducting circuit 200. The second AC clock signal is shown as delayed by a quarter cycle or 90 degrees in phase. Waveforms 320 and 322 correspond to inputs (ai and bi) and thus represent the phase amplitude at terminals T6 and T7, respectively, of superconducting circuit 200 of FIG. 2. Waveform 314 represents the phase amplitude of central junction 224 (at terminal T4 of superconducting circuit 200 of FIG. 2). Waveform 312 represents the phase amplitude at terminal T8 of superconducting circuit 200 of FIG. 2. Waveform 310 corresponds to output (xo) of superconducting circuit 200. As shown in FIG. 3, when both inputs have a high value, central junction 224 cancels the two high values and the phase amplitude at terminal T8 (represented by waveform 312) is insufficient to trigger any of the Josephson junctions in second section 240 and thus the output value stays low. On the other hand, when input ai is high, but input bi is low (as shown via waveforms 322 and 320 respectively), central junction 224 passes the input through to second section 240 (as represented by a high value of waveform 312 at terminal T8). That in turn triggers the Josephson junctions in second section 240 causing output xo to go high (as shown via waveform 310). During the next clock cycle, when both inputs ai and bi are high again, the output is shown as low. In this manner, superconducting circuit 200 and devices that incorporate this circuit provide the functionality associated with an exclusive OR logic gate. Although FIG. 3 shows the two section clocks separated in phase by 90 degrees they may be closer together in phase (e.g., 0 degrees) or further apart in phase (e.g., 135 degrees). In addition, other components may be added to superconducting circuit 200 and that may result in certain changes to the waveforms without departing from the general functionality of an XOR logic gate or an inverter.

Figure 4:
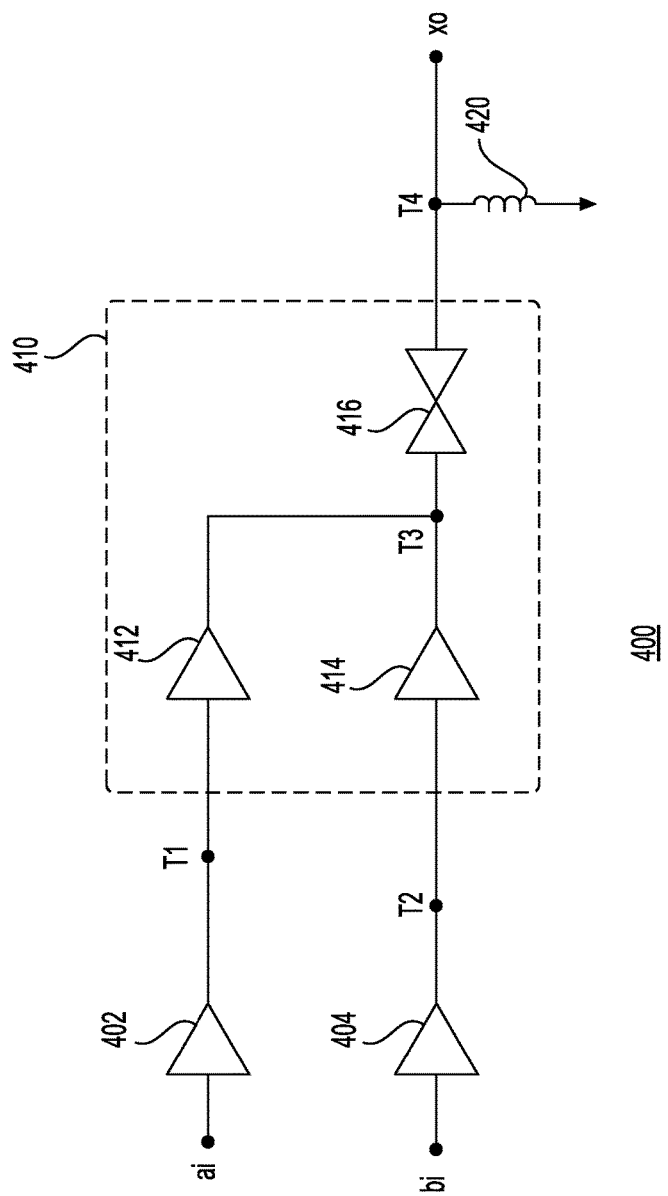
FIG. 4 shows a diagram of a superconducting device in accordance with one example.

FIG. 4 shows a diagram of a superconducting device 400 in accordance with one example. Superconducting device 400 may provide the functionality associated with an exclusive OR (XOR) logic gate in accordance with one example. Superconducting device 400 may also provide the functionality associated with an inverter in accordance with another example. In one example, superconducting device 400 may process two inputs to generate an output. As part of this example, superconducting device 400 may implement the exclusive-OR gate functionality. Superconducting device 400 is similar to superconducting device 100 of FIG. 1, except that it may not include second section 120. Instead, as shown in FIG. 4, an inductor 420 may be used. In this example, input ai may be received via a Josephson transmission line (JTL) 402 and another input bi may be received via Josephson line (JTL) 404. Superconducting device 400 may include a first section 410 and an inductor 420. First section 410 may include an unpowered Josephson junction (JJ) 412 coupled between terminals T1 and T3. First section 410 may further include an unpowered JJ 414 coupled between terminal T2 and terminal T3. First section 410 may further include a central junction 416 coupled between terminal T3 and terminal T4. Inductor 420 may be coupled between terminal T4 and ground. The output xo may be provided via terminal T4, as shown in FIG. 4. The use of inductor 420 may reduce the components required for forming the superconducting device. Although FIG. 4 shows a certain number of components of superconducting device 400 arranged in a certain manner, there could be more or fewer number of components arranged differently. Superconducting device 400 may include circuit components similar to superconducting circuit 200, except that second section 240 may be replaced by inductor 420. In terms of the operation, superconducting device 400 may perform the same functions as described earlier with respect to superconducting device 100.

Figure 5:
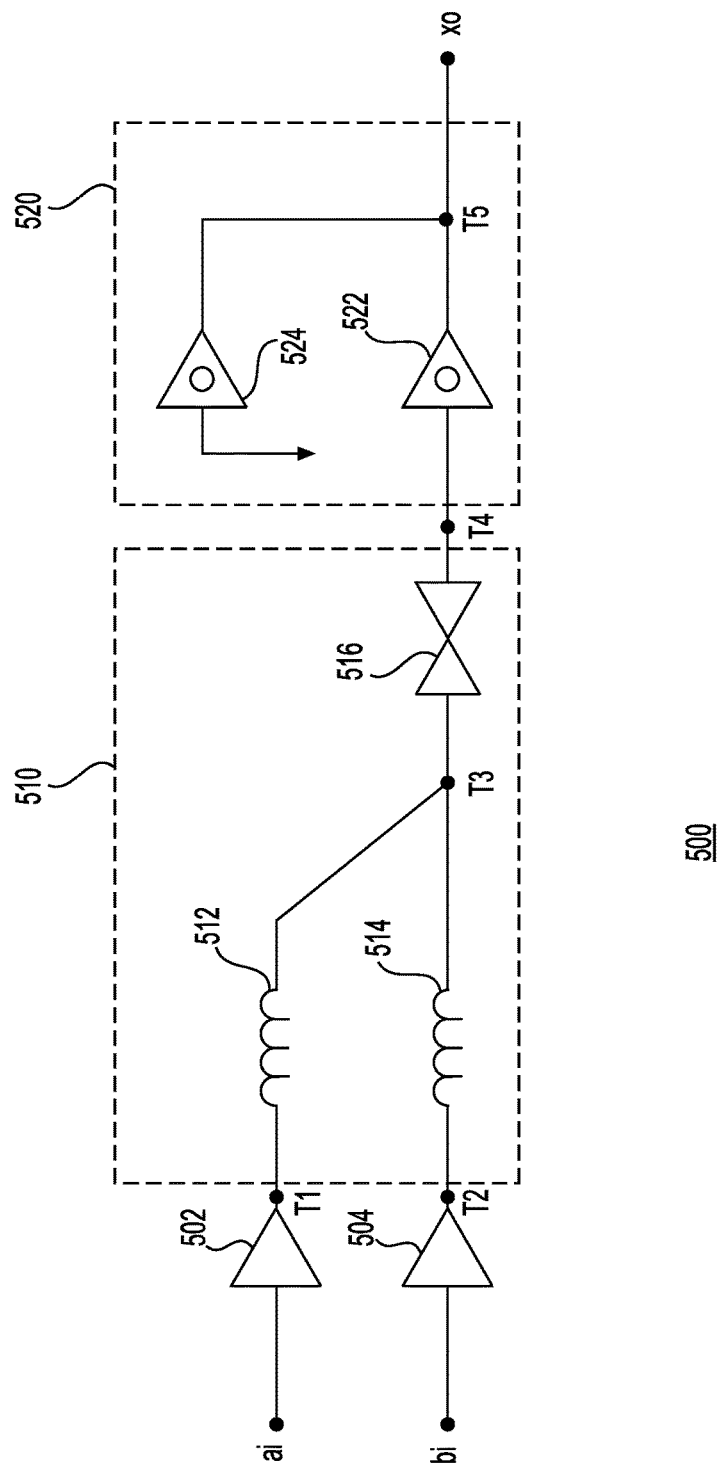
FIG. 5 shows a diagram of a superconducting device in accordance with one example.

FIG. 5 shows a diagram of a superconducting device 500 in accordance with one example. Superconducting device 500 may provide the functionality associated with an exclusive OR (XOR) logic gate in accordance with one example. Superconducting device 500 may also provide the functionality associated with an inverter in accordance with another example. In one example, superconducting device 500 may process two inputs to generate an output. As part of this example, superconducting device 500 may implement the exclusive-OR gate functionality. Superconducting device 500 is similar to superconducting device 100 of FIG. 1, except that the first section may have different components. In this example, input ai may be received via a Josephson transmission line (JTL) 502 and another input bi may be received via Josephson line (JTL) 504. Superconducting device 500 may include a first section 510 and a second section 520. First section 510 may include an inductor 512 coupled between terminals T1 and T3. First section 510 may further include an inductor 514 coupled between terminal T2 and terminal T3. First section 510 may further include a central junction 516 coupled between terminal T3 and terminal T4. Second section 520 may include a JTL 522 coupled between terminal T4 and terminal T5, where terminal T5 may provide an output value xo. Another JTL (JTL 524) may be coupled between terminal T5 and ground. In terms of the operation, input signals comprising quantum pulses, such as single flux quantum (SFQ) pulses, may be received as inputs (e.g., ai and/or bi). The output (xo) may be provided via terminal T5. The Josephson junctions in the various components of second section 520 may be powered using a second AC clock signal, where the second AC clock signal may be delayed in phase by 90 degrees in relation to the phase of the first AC clock signal (used to power central junction 516 in first section 510). The phase difference between two clocks may be in range of 0 degrees to 135 degrees. Although FIG. 5 shows a certain number of components of superconducting device 500 arranged in a certain manner, there could be more or fewer number of components arranged differently. Superconducting device 500 may include circuit components similar to superconducting circuit 100, except that first section 510, instead of the unpowered JJs, may have different components (for example, inductors 512 and 514). In terms of the operation, superconducting device 500 may perform the same functions as described earlier with respect to superconducting device 100.

Figure 6:
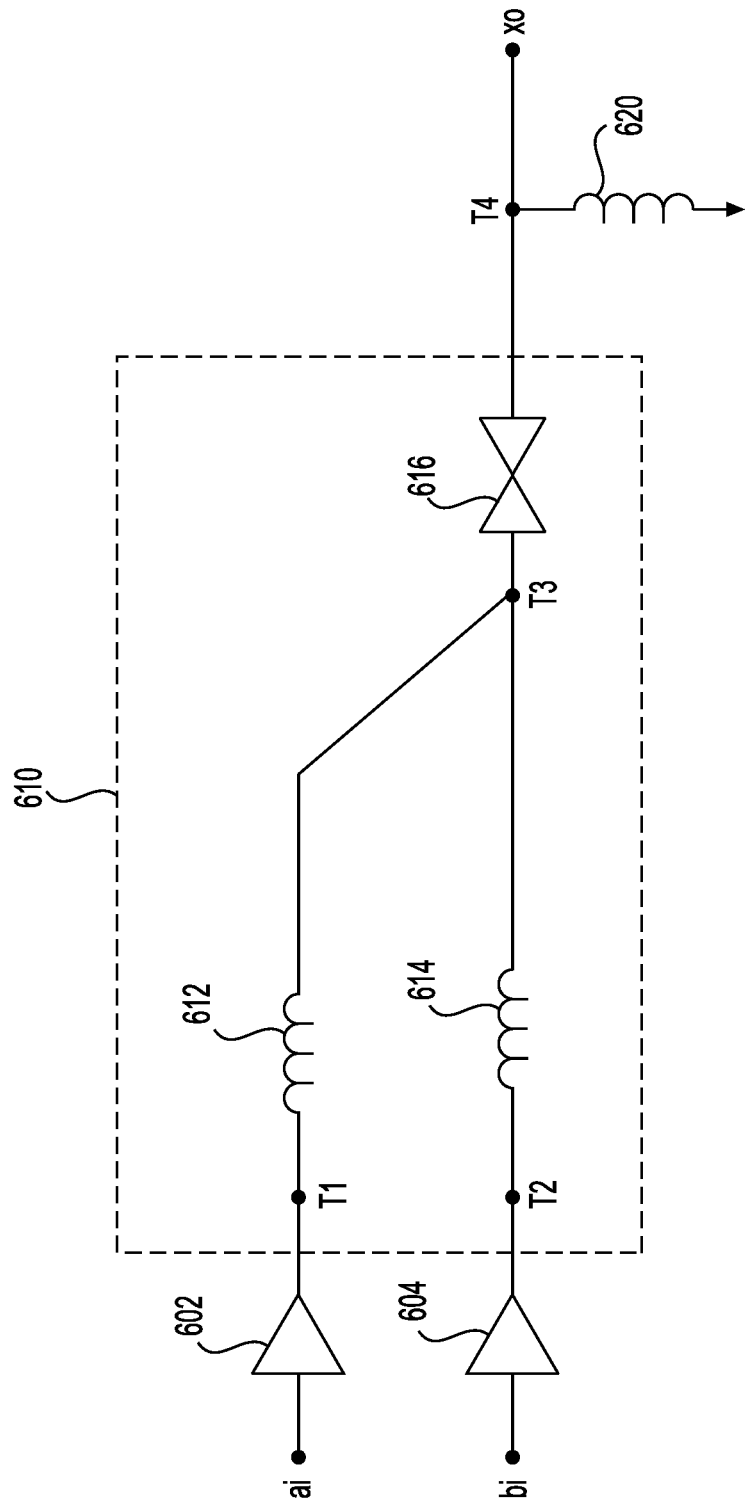
FIG. 6 shows a diagram of a superconducting device in accordance with one example.

FIG. 6 shows a diagram of a superconducting device 600 in accordance with one example. Superconducting device 600 may provide the functionality associated with an exclusive OR (XOR) logic gate in accordance with one example. Superconducting device 600 may also provide the functionality associated with an inverter in accordance with another example. In one example, superconducting device 600 may process two inputs to generate an output. As part of this example, superconducting device 600 may implement the exclusive-OR gate functionality. Superconducting device 600 is similar to superconducting device 100 of FIG. 1, except that the first section and the second section may have different components. In this example, input ai may be received via a Josephson transmission line (JTL) 602 and another input bi may be received via Josephson line (JTL) 604. Superconducting device 600 may include a first section 610 and an inductor 620. First section 610 may include an inductor 612 coupled between terminals T1 and T3. First section 610 may further include an inductor 614 coupled between terminal T2 and terminal T3. First section 610 may further include a central junction 616 coupled between terminal T3 and terminal T4. Inductor 620 may be coupled between terminal T4 and ground. The output xo may be provided via terminal T4, as shown in FIG. 6. The use of inductors 612, 614, and 620 may reduce the components required for forming the superconducting device. In terms of the operation, input signals comprising quantum pulses, such as single flux quantum (SFQ) pulses, may be received as inputs (e.g., ai and/or bi). The output (xo) may be provided via terminal T4. Although FIG. 6 shows a certain number of components of superconducting device 600 arranged in a certain manner, there could be more or fewer number of components arranged differently. In terms of the operation, superconducting device 600 may perform the same functions as described earlier with respect to superconducting device 100.

Figure 7:
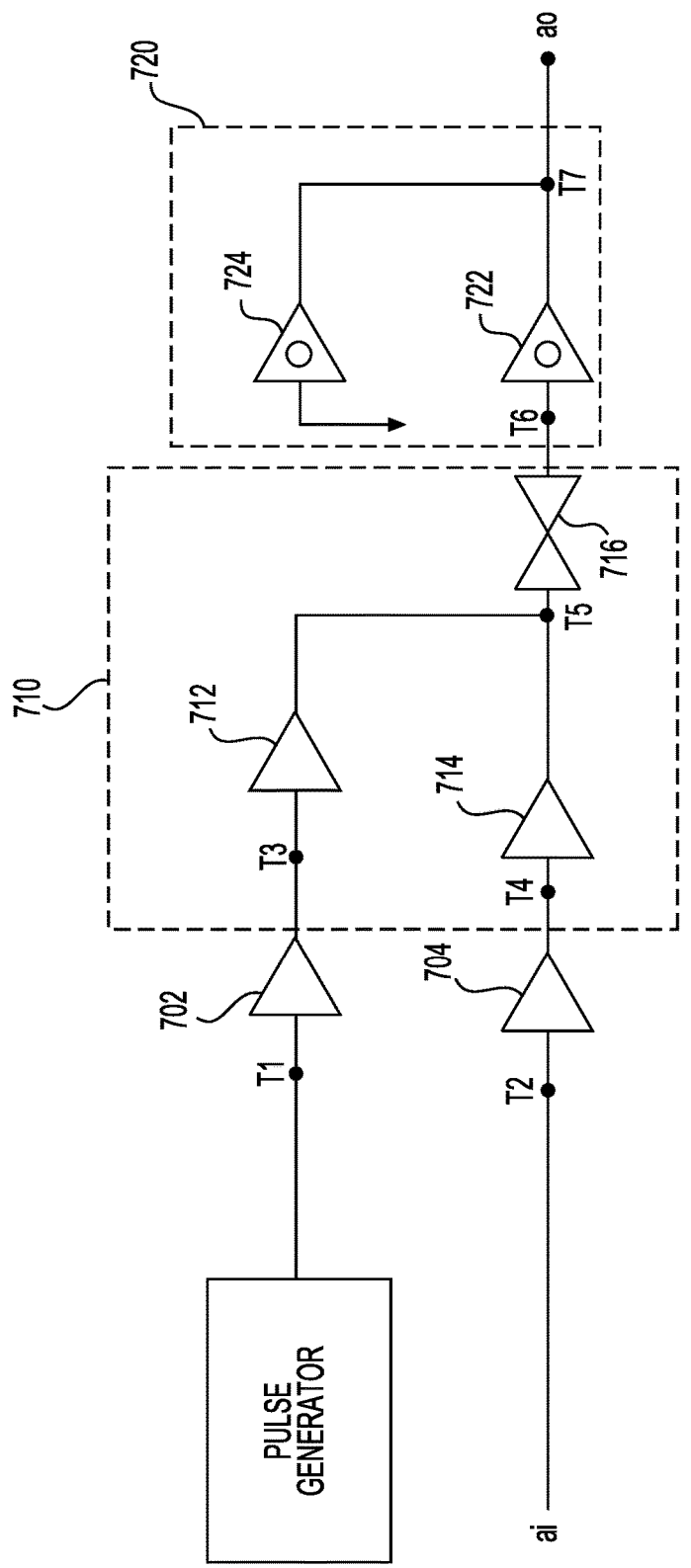
FIG. 7 shows a diagram of a superconducting device in accordance with one example.

FIG. 7 shows a diagram of a superconducting device 700 in accordance with one example. Superconducting device 700 may provide the functionality associated with an inverter in accordance with another example. In one example, superconducting device 700 may process two inputs to generate an output, where one input may be received from a pulse generator coupled to terminal T1 and the other input (ai) may be the input that needs to be inverted. In this example, the pulse generator output may be received via a Josephson transmission line (JTL) 702 and another input (bi) may be received via Josephson line (JTL) 704. Superconducting device 700 may include a first section 710 and a second section 720 as shown in FIG. 7. First section 710 may include an unpowered Josephson junction (JJ) 712 coupled between terminals T3 and T5. First section 710 may further include an unpowered JJ 714 coupled between terminal T4 and terminal T5. First section 710 may further include a central junction 716 coupled between terminal T5 and terminal T6. Central junction 116 may include Josephson junctions powered by a first AC clock signal. Second section 720 may include a JTL 722 coupled between terminal T6 and terminal T7, where terminal T7 may provide an output value ao. Another JTL (JTL 724) may be coupled between terminal T7 and ground. The Josephson junctions in the various components of second section 720 may be powered using a second AC clock signal, where the second AC clock signal may be delayed in phase by 90 degrees in relation to the phase of the first AC clock signal (used to power components in first section 710). The phase difference between two clocks may be in range of 0 degrees to 135 degrees. In terms of the operation, an input signal comprising quantum pulses, such as single flux quantum (SFQ) pulses, may be received as inputs (e.g., ai) and another input signal comprising quantum pulses may be received from the pulse generator. In one example, first section 710 may be configured to pass a single positive pulse originating at the input but to reject two positive pulses originating in the same clock cycle. In addition, first section 710 may provide isolation between the two inputs ai and the pulses from the pulse generator. Second section 720 may be configured to generate a negative output pulse half a clock cycle after a positive output pulse. Second section 720 may further be configured to reset superconducting device 700. In addition, second section 720 may provide isolation and gain. Although FIG. 7 shows a certain number of components of superconducting device 700 arranged in a certain manner, there could be more or fewer number of components arranged differently. Superconducting device 700 may be implemented in a similar fashion as shown in FIG. 2.

Figure 8:
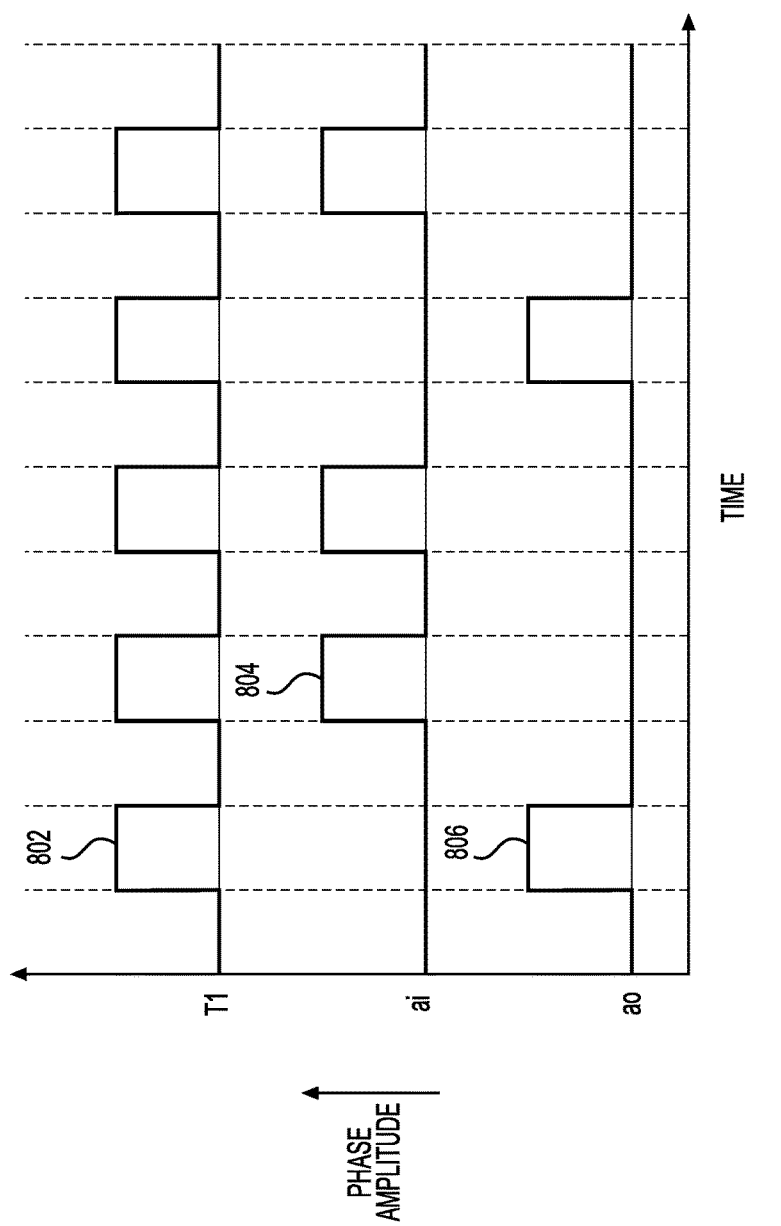
FIG. 8 shows waveforms associated with the superconducting device of FIG. 7 in accordance with one example.

FIG. 8 shows waveforms 800 corresponding to an operation of superconducting device 700 (configured as an inverter). The waveform at terminal T1 generated by a pulse generator corresponds to a sequence of logical "ones." Input (ai), represented by waveform 804, may include a series of pulses encoding information. When processed by superconducting device 700, input (ai) in combination with the pulses received from a pulse generator (shown in FIG. 7) may generate the output (ao) represented by waveform 806. In this example, a positive pulse followed by a negative pulse may represent one bit of information. The first AC clock signal described with respect to FIG. 7, may have a similar waveform as the INPUT SECTION CLOCK (e.g., waveform 302 of FIG. 3) and the second AC clock signal described with respect to FIG. 7, may have a similar waveform as the OUTPUT SECTION CLOCK (e.g., waveform 304 of FIG. 3). In sum, the second AC clock signal may be delayed by a quarter cycle or 90 degrees in phase as shown in FIG. 3. Although, in this example, the two section clocks are separated in phase by 90 degrees they may be closer together in phase (e.g., 0 degrees) or further apart in phase (e.g., 135 degrees).

In conclusion, in one example, the present disclosure relates to a device comprising an output terminal, a first input terminal for receiving a first set of pulses, and a second input terminal for receiving a second set of pulses. The first section may be configured to pass a single pulse received during a single clock cycle at any of the first input terminal or the second input terminal, but to not pass two or more positive pulses received during a single clock cycle at the first input terminal and the second input terminal. The second section, coupled to the first section, may be configured to, in response to the single pulse, generate a negative pulse after a predetermined fraction of a single clock cycle after providing a positive pulse at the output terminal. The device may be configured to operate as one of an exclusive OR logic gate or an inverter.

The first section may further include an unpowered stage comprising: (1) a first unpowered Josephson junction coupled between the first input terminal and a second terminal, and (2) a second unpowered Josephson junction coupled between the first input terminal and the second terminal, where the unpowered stage is configured to pass pulses traveling in a first direction, where the first direction comprises a direction of travel of any pulses from any of the first input terminal or the second input terminal toward the output terminal and block pulses traveling in a second direction, opposite to the first direction. The first section may further include a central junction coupled between the second terminal and a third terminal, where the central junction is configured to pass a single pulse, received during a single clock cycle, but block two or more pulses, received during a single clock cycle. In another example, the first section may include a first stage comprising: (1) a first inductor coupled between the first input terminal and a second terminal, and (2) a second inductor coupled between the first input terminal and the second terminal.

The second section may include a Josephson transmission line (JTL) network coupled between the third terminal and the output terminal, where the JTL network is configured to generate the negative pulse after the predetermined fraction of the single clock cycle after providing the positive pulse at the output terminal. The predetermined fraction of the single clock cycle comprises one half of the single clock cycle. The second section may further comprise an inductor coupled between the output terminal and a ground terminal. The JTL network may be configured to generate the negative pulse via a connection to ground. The central junction and the JTL network may be configured to receive a bias current from an alternating current (AC) clock. Each of the first set of the pulses and the second set of the pulses comprises single-flux quantum (SFQ) pulses, and where each of the SFQ pulses comprises one of a positive SFQ pulse or a negative SFQ pulse.

In another aspect, the present disclosure related to a method of operating a device comprising a first input terminal for receiving a first set of pulses, a second input terminal for receiving a second set of pulses, and an output terminal. The method may include passing a single pulse received during a single clock cycle at any of the first input terminal or the second input terminal, but not passing two or more positive pulses received during a single clock cycle at the first input terminal and the second input terminal. The method may further include in response to the single pulse, generating a negative pulse after a predetermined fraction of a single clock cycle after providing a positive pulse at the output terminal.

The method may further include passing pulses traveling in a first direction, wherein the first direction comprises a direction of travel of any pulses from any of the first input terminal or the second input terminal toward the output terminal and blocking pulses traveling in a second direction, opposite to the first direction. The predetermined fraction of the single clock cycle may comprise one half of the single clock cycle.

In another aspect, the present disclosure relates to an exclusive OR (XOR) logic gate comprising an output terminal, a first input terminal for receiving a first set of pulses, and a second input terminal for receiving a second set of pulses. The XOR logic gate may further include an unpowered stage comprising: (1) a first unpowered Josephson junction coupled between the first input terminal and a second terminal, and (2) a second unpowered Josephson junction coupled between the first input terminal and the second terminal, where the unpowered stage may be configured to pass pulses traveling in a first direction, where the first direction comprises a direction of travel of any pulses from any of the first input terminal or the second input terminal toward the output terminal and block pulses traveling in a second direction, opposite to the first direction. The XOR logic gate may further include a central junction coupled between the second terminal and a third terminal, where the central junction may be configured to pass a single pulse, received during a single clock cycle, but block two or more pulses, received during a single clock cycle. The XOR logic gate may further include a Josephson transmission line (JTL) network coupled between the third terminal and the output terminal, wherein the JTL network may be configured to generate the negative pulse after the predetermined fraction of the single clock cycle after providing the positive pulse at the output terminal.

The predetermined fraction of the single clock cycle may comprise one half of the single clock cycle. Each of the first set of the pulses and the second set of the pulses may comprise single-flux quantum (SFQ) pulses, and each of the SFQ pulses may comprise one of a positive SFQ pulse or a negative SFQ pulse. The JTL network may be configured to generate the negative pulse via a connection to ground. Each of the central junction and the JTL network may be configured to receive a bias current from an alternating current (AC) clock It is to be understood that the methods, modules, and components depicted herein are merely exemplary. Alternatively, or in addition, the functionally described herein can be performed, at least in part, by one or more hardware components. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A device comprising:
an output terminal;
a first input terminal for receiving a first set of pulses;
a second input terminal for receiving a second set of pulses;
a first section configured to pass a single pulse received during a single clock cycle at any of the first input terminal or the second input terminal, but to not pass two or more positive pulses received during a single clock cycle at the first input terminal and the second input terminal, wherein the first section comprises an unpowered stage comprising: (1) a first unpowered Josephson junction coupled between the first input terminal and a second terminal, and (2) a second unpowered Josephson junction coupled between the second input terminal and the second terminal, and wherein the unpowered stage is configured to pass pulses traveling in a first direction, wherein the first direction comprises a direction of travel of any pulses from any of the first input terminal or the second input terminal toward the output terminal and block pulses traveling in a second direction, opposite to the first direction; and
a second section, coupled to the first section, wherein the second section is configured to, in response to the single pulse, generate a negative pulse after a predetermined fraction of a single clock cycle after providing a positive pulse at the output terminal.

2. The device of claim 1, wherein the first section further comprises a central junction coupled between the second terminal and a third terminal, wherein the central junction is configured to pass a single pulse, received during a single clock cycle, but block two or more pulses, received during a single clock cycle.

3. The device of claim 2, wherein the second section comprises a Josephson transmission line (JTL) network coupled between the third terminal and the output terminal, wherein the JTL network is configured to generate the negative pulse after the predetermined fraction of the single clock cycle after providing the positive pulse at the output terminal.

4. The device of claim 3, wherein the predetermined fraction of the single clock cycle comprises one half of the single clock cycle.

5. The device of claim 3, wherein the JTL network is configured to generate the negative pulse via a connection to ground.

6. The device of claim 3, wherein each of the central junction and the JTL network is configured to receive a bias current from an alternating current (AC) clock.

7. The device of claim 2, wherein the second section comprises an inductor coupled between the output terminal and a ground terminal.

8. The device of claim 1, wherein each of the first set of the pulses and the second set of the pulses comprises single-flux quantum (SFQ) pulses, and wherein each of the SFQ pulses comprises one of a positive SFQ pulse or a negative SFQ pulse.

9. The device of claim 1, wherein the device is configured to operate as one of an exclusive OR logic gate or an inverter.

10. The device of claim 1, wherein the first section comprises a first stage comprising: (1) a first inductor coupled between the first input terminal and a second terminal, and (2) a second inductor coupled between the second input terminal and the second terminal.

11. The device of claim 10, wherein the second section comprises an inductor coupled between the output terminal and a ground terminal.

12. A method of operating a device comprising a first input terminal for receiving a first set of pulses, a second input terminal for receiving a second set of pulses, and an output terminal, the method comprising:

passing a single pulse received during a single clock cycle at any of the first input terminal or the second input terminal, but not passing two or more positive pulses received during a single clock cycle at the first input terminal and the second input terminal;

passing pulses traveling in a first direction, wherein the first direction comprises a direction of travel of any pulses from any of the first input terminal or the second input terminal toward the output terminal and blocking pulses traveling in a second direction, opposite to the first direction; and in response to the single pulse, generating a negative pulse after a predetermined fraction of a single clock cycle after providing a positive pulse at the output terminal.

13. The method of claim 12, wherein the predetermined fraction of the single clock cycle comprises one half of the single clock cycle.

14. An exclusive OR (XOR) logic gate comprising:
an output terminal;
a first input terminal for receiving a first set of pulses;
a second input terminal for receiving a second set of pulses;
an unpowered stage comprising: (1) a first unpowered Josephson junction coupled between the first input terminal and a second terminal, and (2) a second unpowered Josephson junction coupled between the second input terminal and the second terminal, wherein the unpowered stage is configured to pass pulses traveling in a first direction, wherein the first direction comprises a direction of travel of any pulses from any of the first input terminal or the second input terminal toward the output terminal and block pulses traveling in a second direction, opposite to the first direction;

a central junction coupled between the second terminal and a third terminal, wherein the central junction is configured to pass a single pulse, received during a single clock cycle, but block two or more pulses, received during a single clock cycle; and a Josephson transmission line (JTL) network coupled between the third terminal and the output terminal, wherein the JTL network is configured to generate the negative pulse after the predetermined fraction of the single clock cycle after providing the positive pulse at the output terminal.

15. The XOR logic gate of claim 14, wherein the predetermined fraction of the single clock cycle comprises one half of the single clock cycle.

16. The XOR logic gate of claim 14, wherein each of the first set of the pulses and the second set of the pulses comprises single-flux quantum (SFQ) pulses, and wherein each of the SFQ pulses comprises one of a positive SFQ pulse or a negative SFQ pulse.

17. The XOR logic gate of claim 14, wherein the JTL network is configured to generate the negative pulse via a connection to ground.

18. The XOR logic gate of claim 14, wherein each of the central junction and the JTL network is configured to receive a bias current from an alternating current (AC) clock.

* * * * *